(12) United States Patent
Khlat et al.

(10) Patent No.: US 8,532,595 B1
(45) Date of Patent: Sep. 10, 2013

(54) OPTIMIZED POWER AMPLIFIER AND SWITCHING POWER SUPPLY TOPOLOGY

(75) Inventors: Nadim Khlat, Midi-Pyrenees (FR); Roman Zbigniew Arkiszewski, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 831 days.

(21) Appl. No.: 12/749,091

(22) Filed: Mar. 29, 2010

Related U.S. Application Data

(60) Provisional application No. 61/164,021, filed on Mar. 27, 2009.

(51) Int. Cl.
*H04B 1/04* (2006.01)

(52) U.S. Cl.
USPC .... 455/127.1; 455/91; 455/114.3; 455/115.1; 455/127.4

(58) Field of Classification Search
USPC ............. 455/91, 101, 102, 103, 114.3, 115.1, 455/120, 121, 126, 127.1, 127.2, 127.3, 127.4, 455/127.5, 129
See application file for complete search history.

(56) References Cited

U.S. PATENT DOCUMENTS

| 7,551,688 B2 * | 6/2009 | Matero et al. ................. 375/297 |
| 2006/0052065 A1 * | 3/2006 | Argaman et al. ............. 455/101 |
| 2009/0021302 A1 | 1/2009 | Elia | |

* cited by examiner

*Primary Examiner* — Tuan Pham
(74) *Attorney, Agent, or Firm* — Withrow & Terranova, P.L.L.C.

(57) ABSTRACT

The present disclosure relates to a single switching power supply that may either provide envelope power to a first RF power amplifier during a first operating mode, or simultaneously provide envelope power to the first RF power amplifier and to a second RF power amplifier during a second operating mode. In one embodiment, the single switching power supply and the first and second RF power amplifiers may be used in a multiple-input multiple-output (MIMO) RF communications system. As such, during the first operating mode, the first RF power amplifier may transmit a first RF output signal to a first antenna, and during the second operating mode, the first RF power amplifier may transmit the first RF output signal to the first antenna and the second RF power amplifier may transmit a second RF output signal to a second antenna, which may provide diversity.

28 Claims, 16 Drawing Sheets

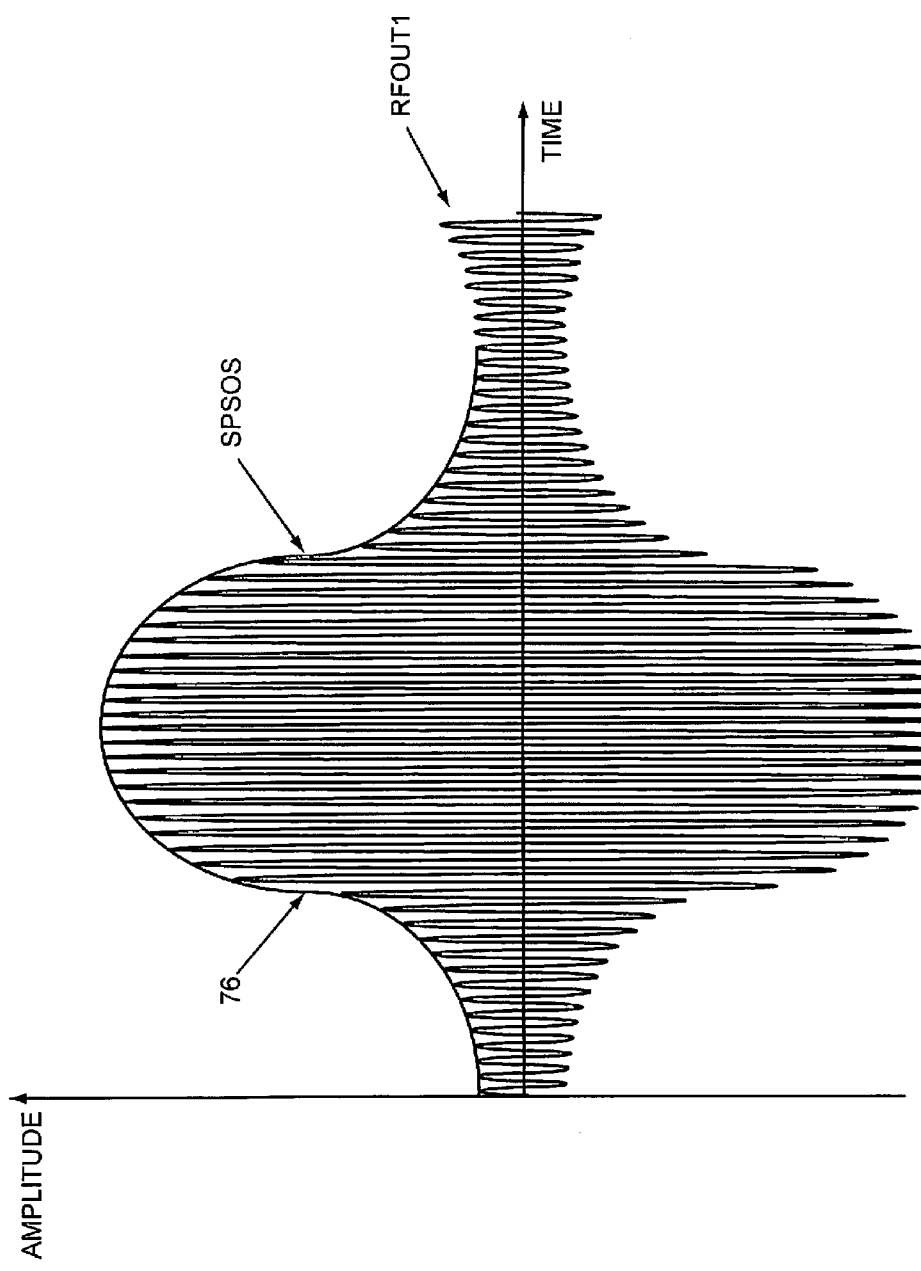

US 8,532,595 B1

OPTIMIZED POWER AMPLIFIER AND SWITCHING POWER SUPPLY TOPOLOGY

This application claims the benefit of provisional patent application Ser. No. 61/164,021, filed Mar. 27, 2009, the disclosure of which is hereby incorporated herein by reference in its entirety.

FIELD OF THE DISCLOSURE

Embodiments of the present disclosure relate to radio frequency (RF) power amplifiers and switching power supplies, both of which may be used in RF communications systems.

BACKGROUND OF THE DISCLOSURE

As wireless technology evolves, the number and variations of wireless communications protocols increase and may encompass multiple operating modes, including half-duplex modes and full duplex modes, multiple frequency bands, various transmit modulation schemes, various transmit power levels, and the like. As a result, wireless communications products may need to provide support for many such protocols. Therefore, RF architectures of wireless products may be complex. Evolving wireless communications protocols may be directed toward transferring as much information as possible, while using as little bandwidth as possible. As a result, certain performance constraints, such as Error Vector Magnitude (EVM) and other linearity constraints, may present significant challenges for wireless communications products. Further, portable wireless products typically are battery powered, need to be as small as possible, and need to have as low a cost as possible. To maximize battery life, portable wireless products may include switching power supplies. Size constraints may limit the size and effectiveness of antennas in portable wireless products. As a result, techniques, such as multiple-input multiple-output (MIMO), may be used to improve the effectiveness of antenna systems, thereby addressing some of the challenges presented to wireless communications products. MIMO systems may use multiple antennas for transmitting, receiving, or both. The additional antennas may provide diversity to overcome RF path problems, such as shading, multipath signal cancellation, and the like. As such, there is a need to reduce sizes and costs of portable wireless products that use switching power supplies and may support multiple modes, multiples bands, multiple protocols, multiple antennas, or any combination thereof.

SUMMARY OF THE EMBODIMENTS

The present disclosure relates to a single switching power supply that may either provide envelope power to a first RF power amplifier during a first operating mode, or simultaneously provide envelope power to the first RF power amplifier and to a second RF power amplifier during a second operating mode. In one embodiment, the single switching power supply and the first and second RF power amplifiers may be used in a multiple-input multiple-output (MIMO) RF communications system. As such, during the first operating mode, the first RF power amplifier may transmit a first RF output signal to a first antenna, and during the second operating mode, the first RF power amplifier may transmit the first RF output signal to the first antenna and the second RF power amplifier may transmit a second RF output signal to a second antenna, which may provide diversity.

By using a single switching power supply instead of two separate supplies, size and cost are reduced. Further, in applications where total transmit power is limited by a Specific Absorption Rate (SAR), total transmitted RF output power may be limited. Therefore, the maximum total RF output power during the first operating mode may be equal to the maximum total RF output power during the second mode. For example, if a mobile terminal, such as a cell phone, has an SAR limit of 25 decibel milliwatts (dBm), during the first operating mode, the first RF power amplifier may transmit an RF output power of about 24 dBm, and during the second operating mode, the first RF power amplifier may transmit an RF output power of about 21 dBm and the second RF power amplifier may transmit an RF output power of about 21 dBm, for a total of about 24 dBm. Therefore, the envelope power provided by the switching power supply is the same, regardless of which operating mode is selected. As such, the single switching power supply may not be required to have any more capacity than either switching power supply in a comparable two power supply system.

SAR is a measure of the amount of RF energy absorbed by a human body when using an RF communications system, such as a cell phone or laptop computer, that is in proximity to the human body. Regulatory agencies, such as the Federal Communications Commission (FCC), may limit the SAR, which effectively limits the RF output power from RF devices in proximity to the human body.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 11A and 11B are graphs showing details of the first RF output signal, a second RF output signal RFOUT2, and a switching power supply output signal according to an alternate embodiment of the first RF communications terminal.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to a single switching power supply that may either provide envelope power to a first RF power amplifier during a first operating mode, or simultaneously provide envelope power to the first RF power amplifier and to a second RF power amplifier during a second operating mode. In one embodiment, the single switching power supply and the first and second RF power amplifiers may be used in a multiple-input multiple-output (MIMO) RF communications system. As such, during the first operating mode, the first RF power amplifier may transmit a first RF output signal to a first antenna, and during the second operating mode, the first RF power amplifier may transmit the first RF output signal to the first antenna and the second RF power amplifier may transmit a second RF output signal to a second antenna, which may provide diversity.

By using a single switching power supply instead of two separate supplies, size and cost are reduced. Further, in applications where total transmit power is limited by a Specific Absorption Rate (SAR), total transmitted RF output power may be limited. Therefore, the maximum total RF output power during the first operating mode may be equal to the maximum total RF output power during the second mode. For example, if a mobile terminal, such as a cell phone, has an SAR limit of 25 decibel milliwatts (dBm), during the first operating mode, the first RF power amplifier may transmit an RF output power of about 24 dBm, and during the second operating mode, the first RF power amplifier may transmit an RF output power of about 21 dBm and the second RF power amplifier may transmit an RF output power of about 21 dBm, for a total of about 24 dBm. Therefore, the envelope power provided by the switching power supply is the same, regardless of which operating mode is selected. As such, the single switching power supply may not be required to have any more capacity than either switching power supply in a comparable two power supply system.

Figure 1:
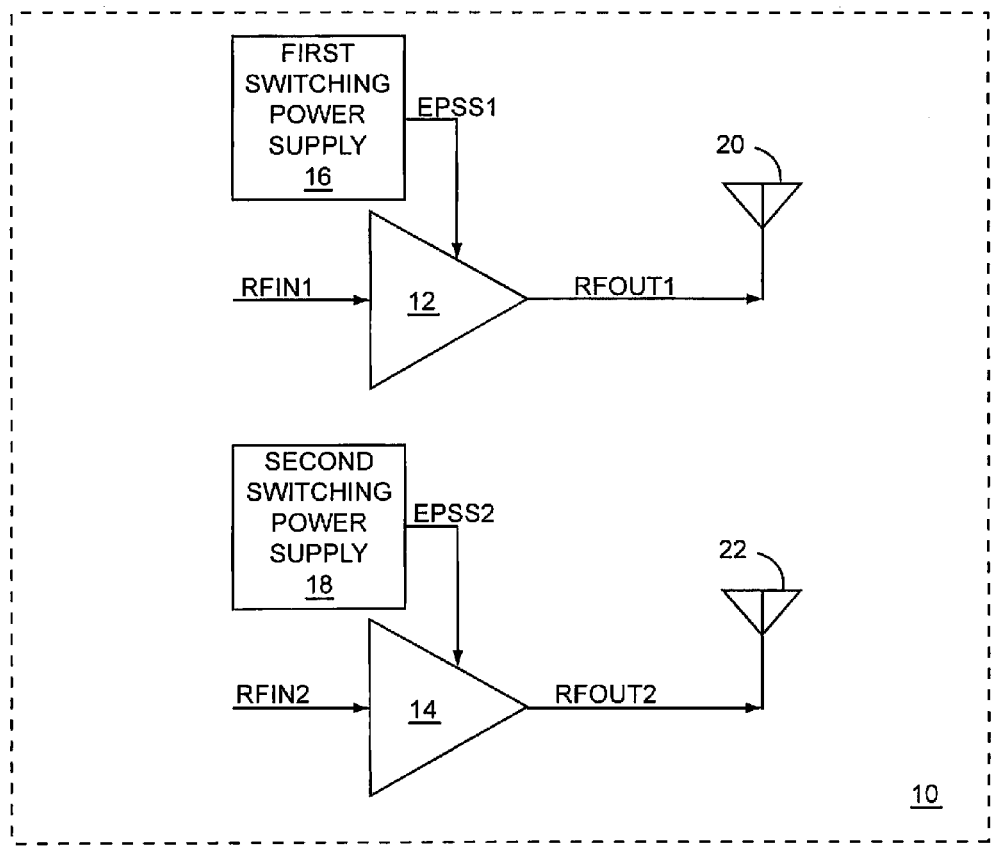
FIG. 1 shows a transmit diversity RF communications system according to the prior art.

FIG. 1 shows a transmit diversity RF communications system 10 according to the prior art. The transmit diversity RF communications system 10 includes a first RF power amplifier 12, a second RF power amplifier 14, a first switching power supply 16, a second switching power supply 18, a primary antenna 20, and a diversity antenna 22. The first RF power amplifier 12 receives and amplifies a first RF input signal RFIN1 to provide a first RF output signal RFOUT1 to the primary antenna 20. The second RF power amplifier 14 receives and amplifies a second RF input signal RFIN2 to provide a second RF output signal RFOUT2 to the diversity antenna 22. The first switching power supply 16 provides first envelope power to the first RF power amplifier 12 via a first envelope power supply signal EPSS1. The first RF power amplifier 12 uses the first envelope power to provide the first RF output signal RFOUT1. The second switching power supply 18 provides second envelope power to the second RF power amplifier 14 via a second envelope power supply signal EPSS2. The second RF power amplifier 14 uses the second envelope power to provide the second RF output signal RFOUT2. The first RF output signal RFOUT1 may be synchronized to the second RF output signal RFOUT2. Further, both the first RF output signal RFOUT1 and the second RF output signal RFOUT2 may be based on the same transmit information, which is sent from the transmit diversity RF communications system 10 to one or more other devices. Sending the same information from two antennas provides diversity, which may improve robustness of the transmit diversity RF communications system 10. Using diversity may compensate for RF path variations or shortcomings.

Figure 2:
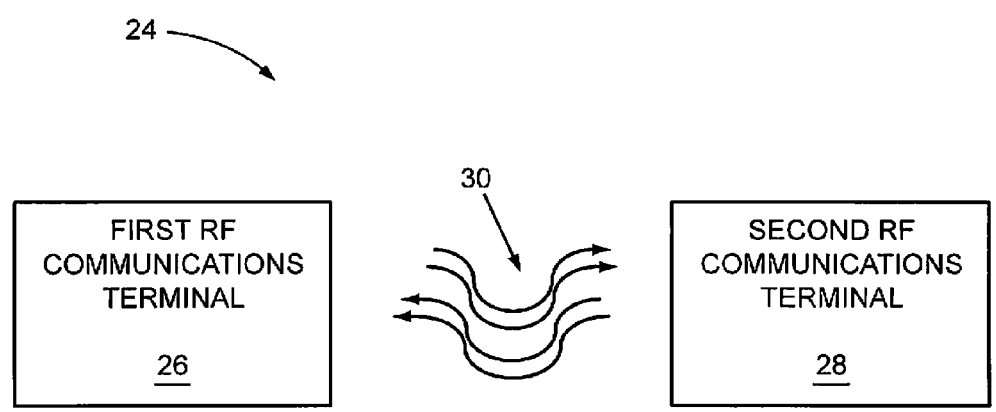
FIG. 2 shows an RF communications system according to one embodiment of the RF communications system.

FIG. 2 shows an RF communications system 24 according to one embodiment of the RF communications system 24. The RF communications system 24 includes a first RF communications terminal 26 and a second RF communications terminal 28. The first RF communications terminal 26 may be communicating with the second RF communications terminal 28 using RF signals 30, which may be transmitted to the first RF communications terminal 26 from the second RF communications terminal 28 and to the second RF communications terminal 28 from the first RF communications terminal 26. In an exemplary embodiment of the RF communications system 24, the second RF communications terminal 28 is a base station, such as on a cell phone tower, and the first RF communications terminal 26 is a mobile communications terminal, such as a cell phone.

Figure 3:
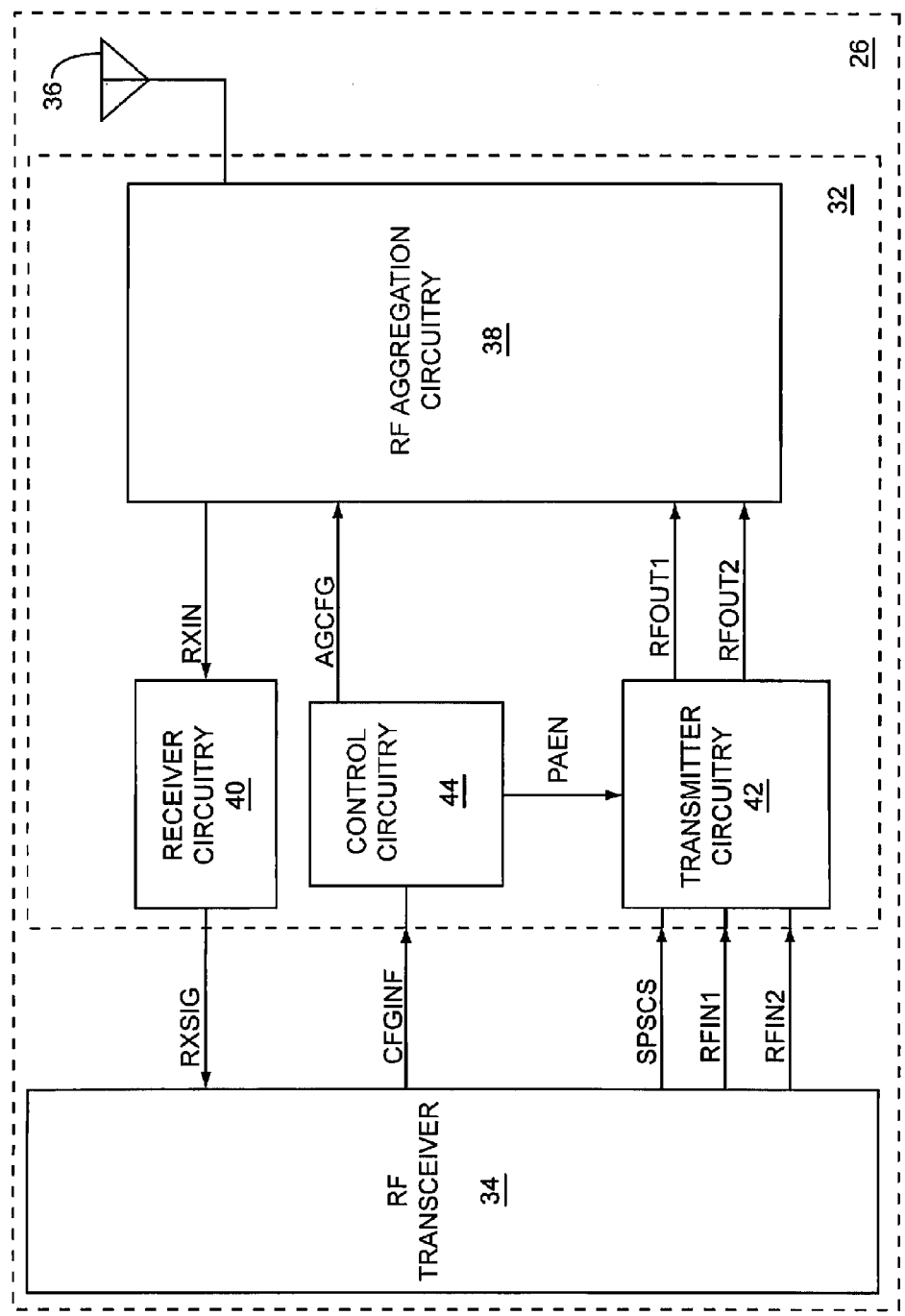
FIG. 3 shows details of a first RF communications terminal illustrated in FIG. 2 according to one embodiment of the first RF communications terminal.

FIG. 3 shows details of the first RF communications terminal 26 illustrated in FIG. 2 according to one embodiment of the first RF communications terminal 26. The first RF communications terminal 26 includes RF front-end circuitry 32, an RF transceiver 34, and a first antenna 36. The RF front-end circuitry 32 includes RF aggregation circuitry 38, receiver circuitry 40, transmitter circuitry 42, and control circuitry 44. The RF aggregation circuitry 38 is coupled between the receiver circuitry 40 and the first antenna 36 and is coupled between the transmitter circuitry 42 and the first antenna 36. The first RF communications terminal 26 may transmit and receive RF signals 30 using the first antenna 36. The RE aggregation circuitry 38 may receive the RF signals 30 and provide one or more receive input signal RXIN to the receiver circuitry 40 based on the received RF signals 30. Further, the RF aggregation circuitry 38 may receive a first RF output signal RFOUT1 and a second RF output signal RFOUT2 from the transmitter circuitry 42 and provide transmit signals to the first antenna 36 based on the first RF output signal RFOUT1 and the second RF output signal RFOUT2. As such, the RF aggregation circuitry 38 may include RF switching circuitry, bandpass filters, duplexers, diplexers, RF switches, impedance matching networks, other RF filters, RF amplifiers, RF power detectors, the like, or any combination thereof. The control circuitry 44 may configure the RF aggregation circuitry 38 for proper operation using one or more aggregation configuration signal AGCFG.

The receiver circuitry 40 receives the one or more receive input signal RXIN and provides one or more receive signal RXSIG to the RF transceiver 34 based on the one or more receive input signal RXIN. The receiver circuitry 40 may include filtering circuitry, amplification circuitry, down conversion circuitry, the like, or any combination thereof. In one embodiment of the receiver circuitry 40, the receiver circuitry 40 is multi-band receiver circuitry and may include many parallel receive paths, such that each receive path may be associated with one or more receive band.

The RF transceiver 34 provides a first RF input signal RFIN1, a second RF input signal RFIN2, and a switching power supply control signal SPSCS to the transmitter circuitry 42. The transmitter circuitry 42 amplifies the first RF input signal RFIN1 to provide the first RF output signal RFOUT1 and amplifies the second RF input signal RFIN2 to provide the second RF output signal RFOUT2. The control circuitry 44 provides a power amplifier enable signal PAEN to the transmitter circuitry 42 to configure the transmitter circuitry 42 for proper operation. Further, the control circuitry 44 receives configuration information CFGINF from the RF transceiver 34 and provides the power amplifier enable signal PAEN and the one or more aggregation configuration signal AGCFG based on the configuration information CFGINF.

In a first exemplary embodiment of the first RF communications terminal 26, the first RF communications terminal 26 is a multi-band RF communications terminal. In a second exemplary embodiment of the first RF communications terminal 26, the first RF communications terminal 26 is a multi-mode RF communications terminal. In a third exemplary embodiment of the first RF communications terminal 26, the first RF communications terminal 26 is a multi-mode multi-band RF communications terminal. A multi-mode RF communications terminal may operate using simplex communications, using half-duplex communications, using full duplex communications, or simultaneously using any combination thereof. A multi-band RF communications terminal may transmit, receive, or both, RF signals 30 using any of a number RF communications bands. A multi-mode multi-band RF communications terminal may combine the functionality of the multi-mode RF communications terminal and the functionality of the multi-band RF communications terminal. As such, other embodiments of the first RF communications terminal 26 may use additional RF transmit signals, RF receive signals, or both.

Figure 4:
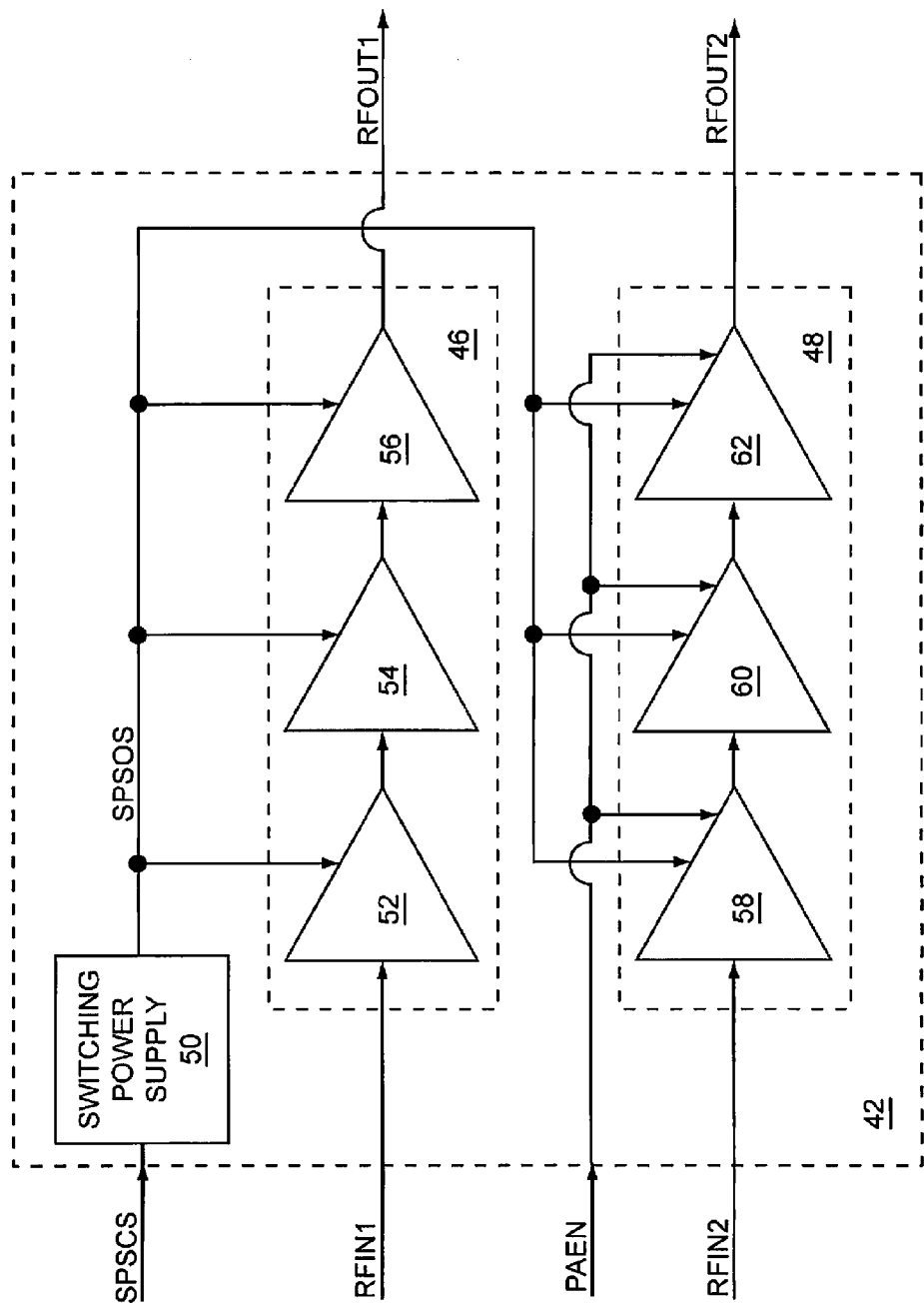
FIG. 4 shows details of transmitter circuitry illustrated in FIG. 3 according to one embodiment of the transmitter circuitry.

FIG. 4 shows details of the transmitter circuitry 42 illustrated in FIG. 3 according to one embodiment of the transmitter circuitry 42. The transmitter circuitry 42 includes a first RF power amplifier chain 46, a second RF power amplifier chain 48, and a switching power supply 50. The first RF power amplifier chain 46 includes a first initial driver stage 52, a first intermediate driver stage 54, and a first final stage 56 coupled in series, such that the first initial driver stage 52 feeds the first intermediate driver stage 54, which feeds the first final stage 56. The second RF power amplifier chain 48 includes a second initial driver stage 58, a second intermediate driver stage 60, and a second final stage 62 coupled in series, such that the second initial driver stage 58 feeds the second intermediate driver stage 60, which feeds the second final stage 62.

Under certain circumstances, the first initial driver stage 52 receives the first RF input signal RFIN1 and the first final stage 56 provides the first RF output signal RFOUT1 based on amplifying the first RF input signal RFIN1. Similarly, under certain circumstances, the second initial driver stage 58 receives the second RF input signal RFIN2 and the second final stage 62 provides the second RF output signal RFOUT2 based on amplifying the second RF input signal RFIN2. The switching power supply 50 receives the switching power supply control signal SPSCS and provides the switching power supply output signal SPSOS to the first initial driver stage 52, the first intermediate driver stage 54, the first final stage 56, the second initial driver stage 58, the second intermediate driver stage 60, and the second final stage 62 based on the switching power supply control signal SPSCS. The second initial driver stage 58, the second intermediate driver stage 60, and the second final stage 62 receive the power amplifier enable signal PAEN from the control circuitry 44. In this regard, the control circuitry 44 may either enable or disable the second initial driver stage 58, the second intermediate driver stage 60, and the second final stage 62 using the power amplifier enable signal PAEN.

In one embodiment of the control circuitry 44, the control circuitry 44 selects one of a first operating mode, a second operating mode, and a third operating mode. Selection of the operating mode may be based on the configuration information CFGINF. As such, the RF transceiver 34 may initiate selection of the operating mode. During the first operating mode, the first RF communications terminal 26 may transmit the first RF output signal RFOUT1 from the first final stage 56 and the switching power supply 50 may provide first envelope power to the first initial driver stage 52, to the first intermediate driver stage 54, and to the first final stage 56 via the switching power supply output signal SPSOS. During the first operating mode, the second RF power amplifier chain 48 may be inhibited from providing the second RF output signal RFOUT2. Specifically, during the first operating mode, the second initial driver stage 58, the second intermediate driver stage 60, and the second final stage 62 may be disabled based on the power amplifier enable signal PAEN.

During the second operating mode, the first RF communications terminal 26 may transmit the first RF output signal RFOUT1 from the first final stage 56; the first RF communications terminal 26 may transmit the second RF output signal RFOUT2 from the second final stage 62; the switching power supply 50 may provide the first envelope power to the first initial driver stage 52, to the first intermediate driver stage 54, and to the first final stage 56 via the switching power supply output signal SPSOS; and the switching power supply 50 may provide second envelope power to the second initial driver stage 58, to the second intermediate driver stage 60, and to the second final stage 62 via the switching power supply output signal SPSOS.

In one embodiment of the first RF communications terminal 26, the first RF communications terminal 26 incorporates transmit diversity, such that the same information is transmitted from two separate antennas. In this regard, during the second operating mode, transmitted information provided by the second RF output signal RFOUT2 may be about equal to transmitted information provided by the first RF output signal RFOUT1, and modulation of the second RE output signal RFOUT2 may be synchronized to modulation of the first RF output signal RFOUT1. To effectively provide transmit diversity, the second RF output signal RFOUT2 may be somewhat different from the first RF output signal RFOUT1. During the second operating mode, a carrier of the first RF output signal RFOUT1 may be phase-shifted from a carrier of the second RF output signal RFOUT2, and an average power level of the first RF output signal RFOUT1 may not be equal to an average power level of the second RF output signal RFOUT2. Transmit diversity may or may not be used as part of a multimode RF communications terminal. As such, in one embodiment of the transmitter circuitry 42, the first final stage 56 is a multi-mode final stage and the second final stage 62 is a single-mode final stage.

In a first exemplary embodiment of the first RF communications terminal 26, during the second operating mode, the average power level of the first RF output signal RFOUT1 is about one dBm greater than the average power level of the second RF output signal RFOUT2. In a second exemplary embodiment of the first RF communications terminal 26, during the second operating mode, the average power level of the first RF output signal RFOUT1 is about two dBm greater than the average power level of the second RF output signal RFOUT2. In a third exemplary embodiment of the first RF communications terminal 26, during the second operating mode, the average power level of the first RF output signal RFOUT1 is about three dBm greater than the average power level of the second RF output signal RFOUT2.

In a fourth exemplary embodiment of the first RF communications terminal 26, during the second operating mode, the average power level of the first RF output signal RFOUT1 is about one dBm less than the average power level of the second RF output signal RFOUT2. In a fifth exemplary embodiment of the first RF communications terminal 26, during the second operating mode, the average power level of the first RF output signal RFOUT1 is about two dBm less than the average power level of the second RF output signal RFOUT2. In a sixth exemplary embodiment of the first RF communications terminal 26, during the second operating mode, the average power level of the first RF output signal RFOUT1 is about three dBm less than the average power level of the second RE output signal RFOUT2.

The third operating mode may include combinations not covered by the first and the second operating modes. As such, during the third operating mode, either or both of the first RF power amplifier chain 46 and the second RF power amplifier chain 48 may be operational, or both the first RF power amplifier chain 46 and the second RF power amplifier chain 48 may be non-operational.

Alternate embodiments of the first RF power amplifier chain 46 may omit either or both of the first initial driver stage 52 and the first intermediate driver stage 54, or may include additional driver stages coupled in series with the first initial driver stage 52, the first intermediate driver stage 54, and the first final stage 56. Either or both of the first initial driver stage 52 and the first intermediate driver stage 54 may not receive the switching power supply output signal SPSOS. As such, either or both of the first initial driver stage 52 and the first intermediate driver stage 54 may not receive the first envelope power from the switching power supply 50.

Alternate embodiments of the second RF power amplifier chain 48 may omit either or both of the second initial driver stage 58 and the second intermediate driver stage 60, or may include additional driver stages coupled in series the second initial driver stage 58, the second intermediate driver stage 60, and the second final stage 62. Either or both of the second initial driver stage 58 and the second intermediate driver stage 60 may not receive the switching power supply output signal SPSOS. As such, either or both of the second initial driver stage 58 and the second intermediate driver stage 60 may not receive the second envelope power from the switching power supply 50 during the second operating mode. Further, either or both of the second initial driver stage 58 and the second intermediate driver stage 60 may not receive the power amplifier enable signal PAEN, such that during the first operating mode, either or both of the second initial driver stage 58 and the second intermediate driver stage 60 may remain enabled.

Figure 5:
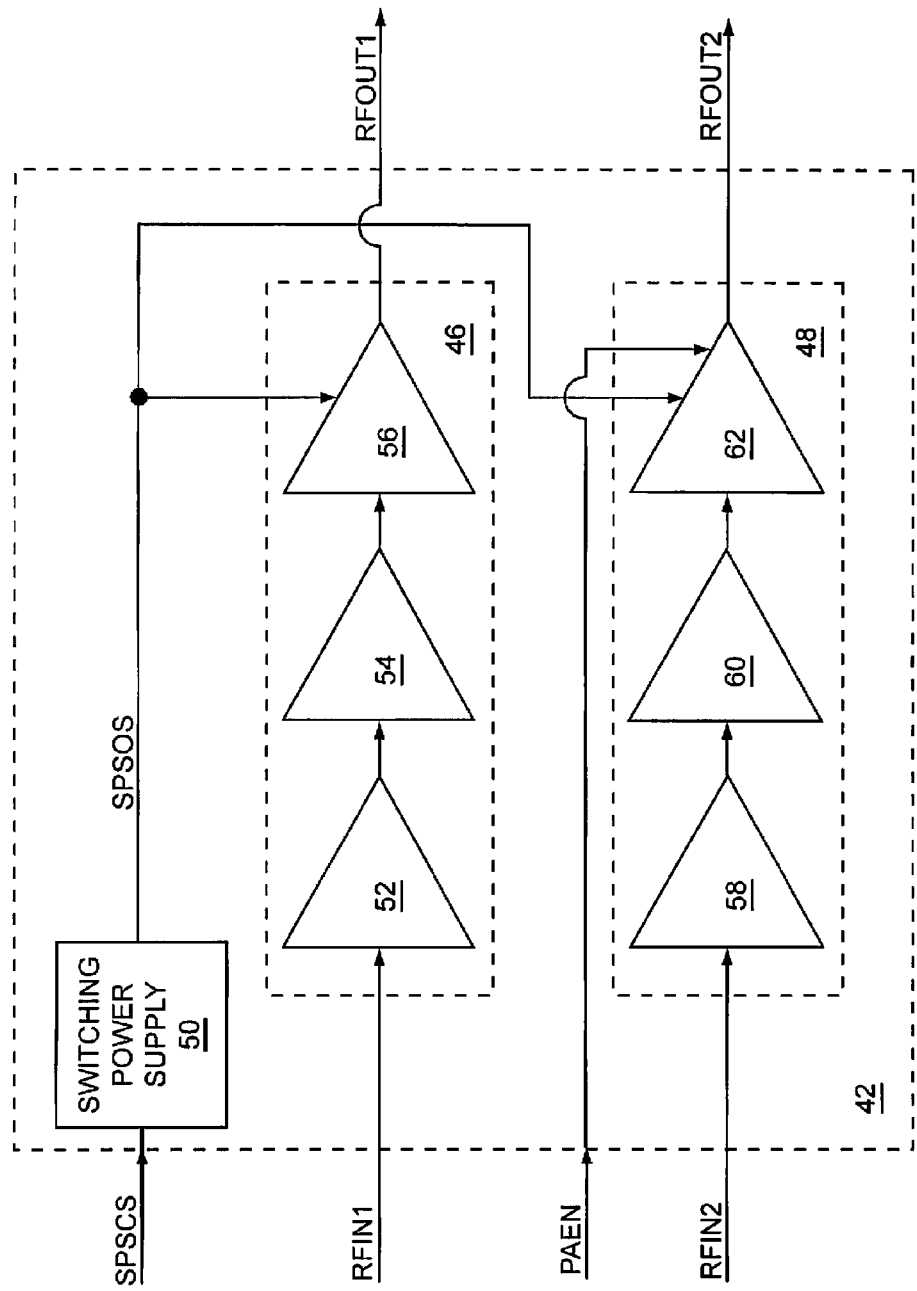
FIG. 5 shows details of the transmitter circuitry illustrated in FIG. 3 according to an alternate embodiment of the transmitter circuitry.

FIG. 5 shows details of the transmitter circuitry 42 illustrated in FIG. 3 according to an alternate embodiment of the transmitter circuitry 42. The transmitter circuitry 42 illustrated in FIG. 5 is similar to the transmitter circuitry 42 illustrated in FIG. 4, except in the transmitter circuitry 42 illustrated in FIG. 5, the first initial driver stage 52, the first intermediate driver stage 54, the second initial driver stage 58, and the second intermediate driver stage 60 do not receive the switching power supply output signal SPSOS. As such, during the first operating mode, only the first final stage 56 receives the first envelope power from the switching power supply 50 via the switching power supply output signal SPSOS. During the second operating mode, only the first final stage 56 receives the first envelope power via the switching power supply output signal SPSOS, and only the second final stage 62 receives the second envelope power via the switching power supply output signal SPSOS. Further, the second initial driver stage 58 and the second intermediate driver stage 60 do not receive the power amplifier enable signal PAEN. As such, during the first operating mode, the second initial driver stage 58 and the second intermediate driver stage 60 may remain enabled.

Figure 6:
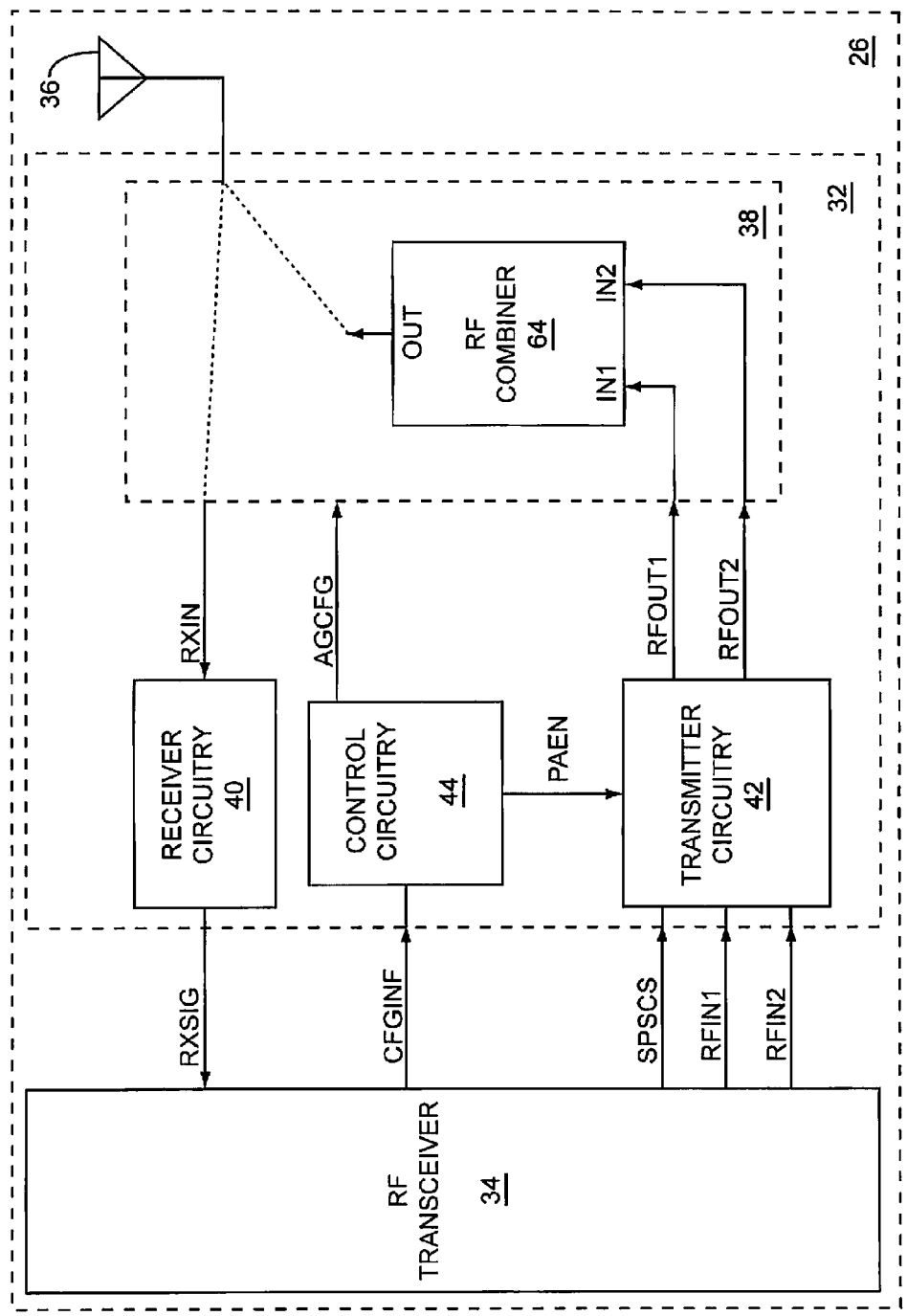
FIG. 6 shows details of RF aggregation circuitry illustrated in FIG. 3 according to one embodiment of the RF aggregation circuitry.

FIG. 6 shows details of the RF aggregation circuitry 38 illustrated in FIG. 3 according to one embodiment of the RF aggregation circuitry 38. The RF aggregation circuitry 38 includes a RF combiner 64 having a first input IN1, a second input IN2, and an output OUT. In general, an output from the first final stage 56 (FIG. 4) is coupled to the first antenna 36 through the RF combiner 64, and an output from the second final stage 62 (FIG. 4) is coupled to the first antenna 36 through the RF combiner 64. Specifically, the output of the first final stage 56 is coupled to the first input IN1 and the output of the second final stage 62 is coupled to the second input IN2. The output OUT is coupled to the first antenna 36. The RF combiner 64 combines RF signals at the first input IN1 and the second input IN2 to provide a combined RF signal from the output OUT. The first input IN1 receives the first RF output signal RFOUT1 and the second input IN2 receives the second RF output signal RFOUT2. Therefore, the RF combiner 64 combines the first RF output signal RFOUT1 and the second RF output signal RFOUT2 to provide a combined RF output signal to the first antenna 36 from the output OUT.

Figure 7A:
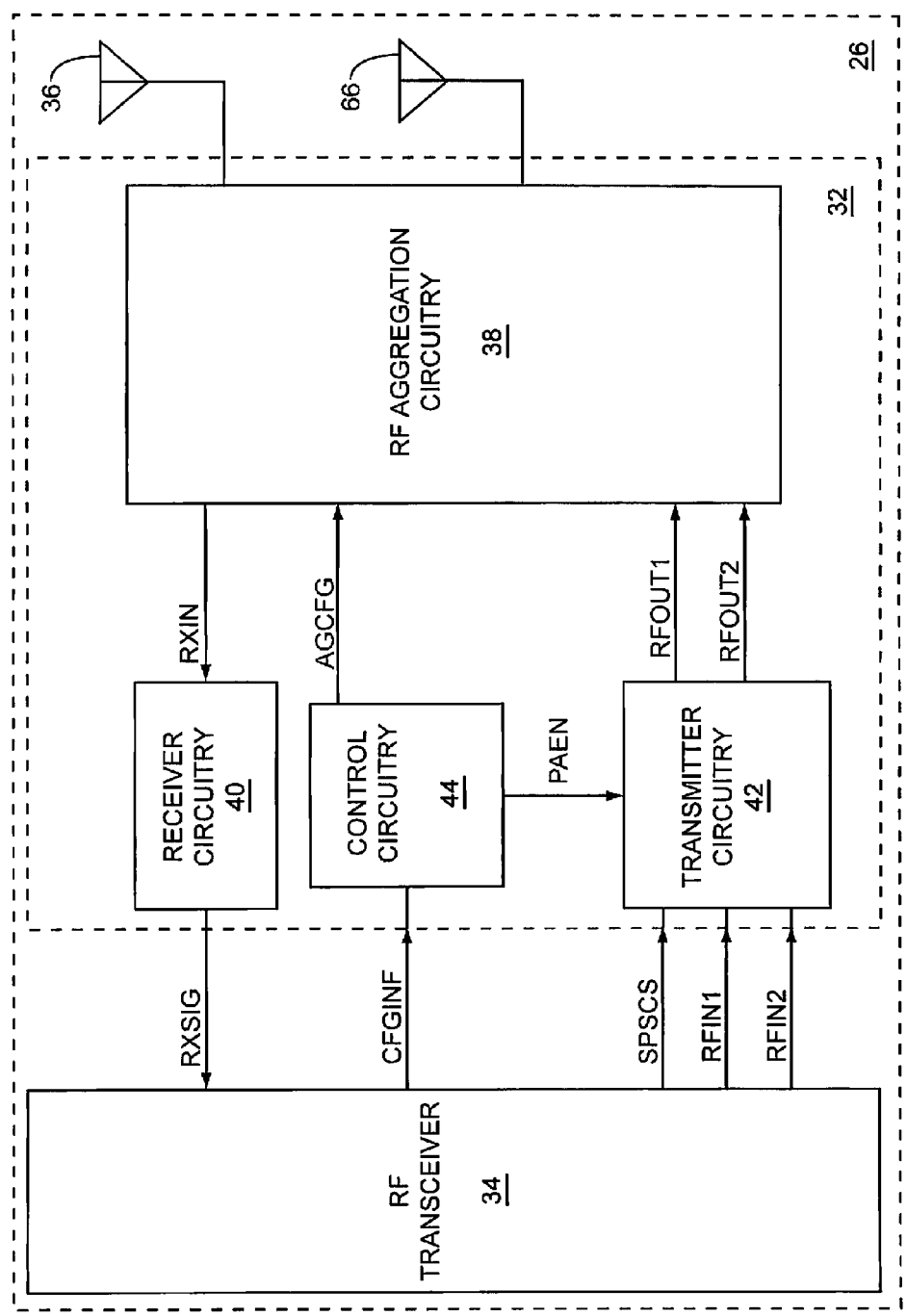
FIG. 7A shows details of the first RF communications terminal illustrated in FIG. 2 according to an alternate embodiment of the first RF communications terminal.

FIG. 7A shows details of the first RF communications terminal 26 illustrated in FIG. 2 according to an alternate embodiment of the first RF communications terminal 26. The first RF communications terminal 26 illustrated in FIG. 7A is similar to the first RF communications terminal 26 illustrated in FIG. 3, except the first RF communications terminal 26 illustrated in FIG. 7A further includes a second antenna 66 coupled to the RF aggregation circuitry 38.

The first RF communications terminal 26 includes the RF front-end circuitry 32, the RF transceiver 34, the first antenna 36, and the second antenna 66. The RF front-end circuitry 32 includes the RF aggregation circuitry 38, the receiver circuitry 40, the transmitter circuitry 42, and the control circuitry 44. The RF aggregation circuitry 38 is coupled between the receiver circuitry 40 and the first antenna 36 and is coupled between the transmitter circuitry 42 and the first antenna 36. Further, the RE aggregation circuitry 38 is coupled between the receiver circuitry 40 and the second antenna 66 and is coupled between the transmitter circuitry 42 and the second antenna 66. The first RF communications terminal 26 may transmit and receive RF signals 30 using the first antenna 36 and the second antenna 66. The RF aggregation circuitry 38 may receive the RF signals 30 and provide one or more receive input signal RXIN to the receiver circuitry 40 based on the received RF signals 30. Further, the RF aggregation circuitry 38 may receive a first RF output signal RFOUT1 and a second RF output signal RFOUT2 from the transmitter circuitry 42 and provide transmit signals to the first antenna 36, to the second antenna 66, or both, based on the first RF output signal RFOUT1 and the second RF output signal RFOUT2. As such, the RF aggregation circuitry 38 may include RF switching circuitry, bandpass filters, duplexers, diplexers, RF switches, impedance matching networks, other RF filters, RF amplifiers, RF power detectors, the like, or any combination thereof. The control circuitry 44 may configure the RF aggregation circuitry 38 for proper operation using one or more aggregation configuration signal AGCFG.

The receiver circuitry 40 receives the one or more receive input signal RXIN and provides the one or more receive signal RXSIG to the RF transceiver 34 based on the one or more receive input signal RXIN. The receiver circuitry 40 may include filtering circuitry, amplification circuitry, down conversion circuitry, the like, or any combination thereof. In one embodiment of the receiver circuitry 40, the receiver circuitry 40 is multi-band receiver circuitry and may include many parallel receive paths, such that each receive path may be associated with one or more receive band.

The RF transceiver 34 provides the first RF input signal RFIN1, the second RF input signal RFIN2, and the switching power supply control signal SPSCS to the transmitter circuitry 42. The transmitter circuitry 42 amplifies the first RF input signal RFIN1 to provide the first RF output signal RFOUT1 and amplifies the second RF input signal RFIN2 to provide the second RF output signal RFOUT2. The control circuitry 44 provides the power amplifier enable signal PAEN to the transmitter circuitry 42 to configure the transmitter circuitry 42 for proper operation. Further, the control circuitry 44 receives the configuration information CFGINF from the RF transceiver 34 and provides the power amplifier enable signal PAEN and the one or more aggregation configuration signal AGCFG based on the configuration information CFGINF.

In a first exemplary embodiment of the first RF communications terminal 26, the first RF communications terminal 26 is a multi-band RF communications terminal. In a second exemplary embodiment of the first RF communications terminal 26, the first RF communications terminal 26 is a multi-mode RF communications terminal. In a third exemplary embodiment of the first RF communications terminal 26, the first RF communications terminal 26 is a multi-mode multi-band RF communications terminal. A multi-mode RF communications terminal may operate using simplex communications, using half-duplex communications, using full duplex communications, or simultaneously using any combination thereof. A multi-band RF communications terminal may transmit, receive, or both, RF signals 30 using any of a number RF communications bands. A multi-mode multi-band RF communications terminal may combine the functionality of the multi-mode RF communications terminal and the functionality of the multi-band RF communications terminal. As such, other embodiments of the first RF communications terminal 26 may use additional RF transmit signals, RF receive signals, or both.

Figure 7B:
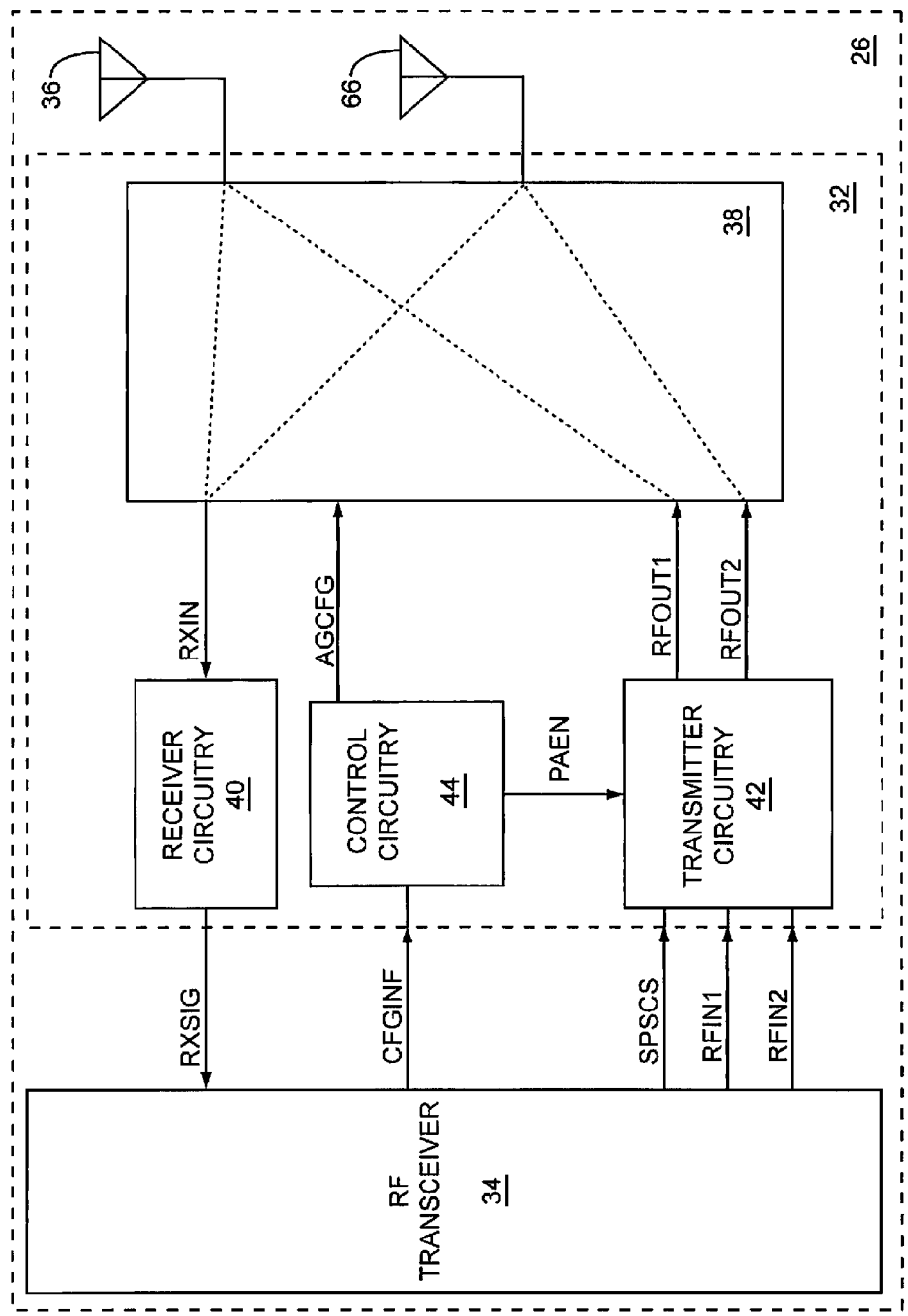
FIG. 7B shows details of the RF aggregation circuitry illustrated in FIG. 7A according to one embodiment of the RF aggregation circuitry.

FIG. 7B shows details of the RF aggregation circuitry 38 illustrated in FIG. 7A according to one embodiment of the RF aggregation circuitry 38. The output of the first final stage 56 (FIG. 4) may be coupled to the first antenna 36 through circuitry in the RF aggregation circuitry 38 and the output of the second final stage 62 (FIG. 4) may be coupled to the second antenna 66 through circuitry in the RF aggregation circuitry 38. In this regard, the first RF output signal RFOUT1 may be fed to the first antenna 36 and the second RF output signal RFOUT2 may be fed to the second antenna 66. In one embodiment of the first RF communications terminal 26, the first RF communications terminal 26 employs transmit diversity, such that the first antenna 36 is a primary antenna and the second antenna 66 is a diversity antenna.

In one embodiment of the first RF communications terminal 26, SAR restrictions limit an average power level transmitted by the first RF communications terminal 26 to be no more than 25 dBm. As such, during the first operating mode, a maximum average power level transmitted by the first antenna 36 is less than 25 dBm, and during the second operating mode, a sum of a maximum average power level transmitted by the first antenna 36 and a maximum average power level transmitted by the second antenna 66 is less than 25 dBm.

Figure 8:
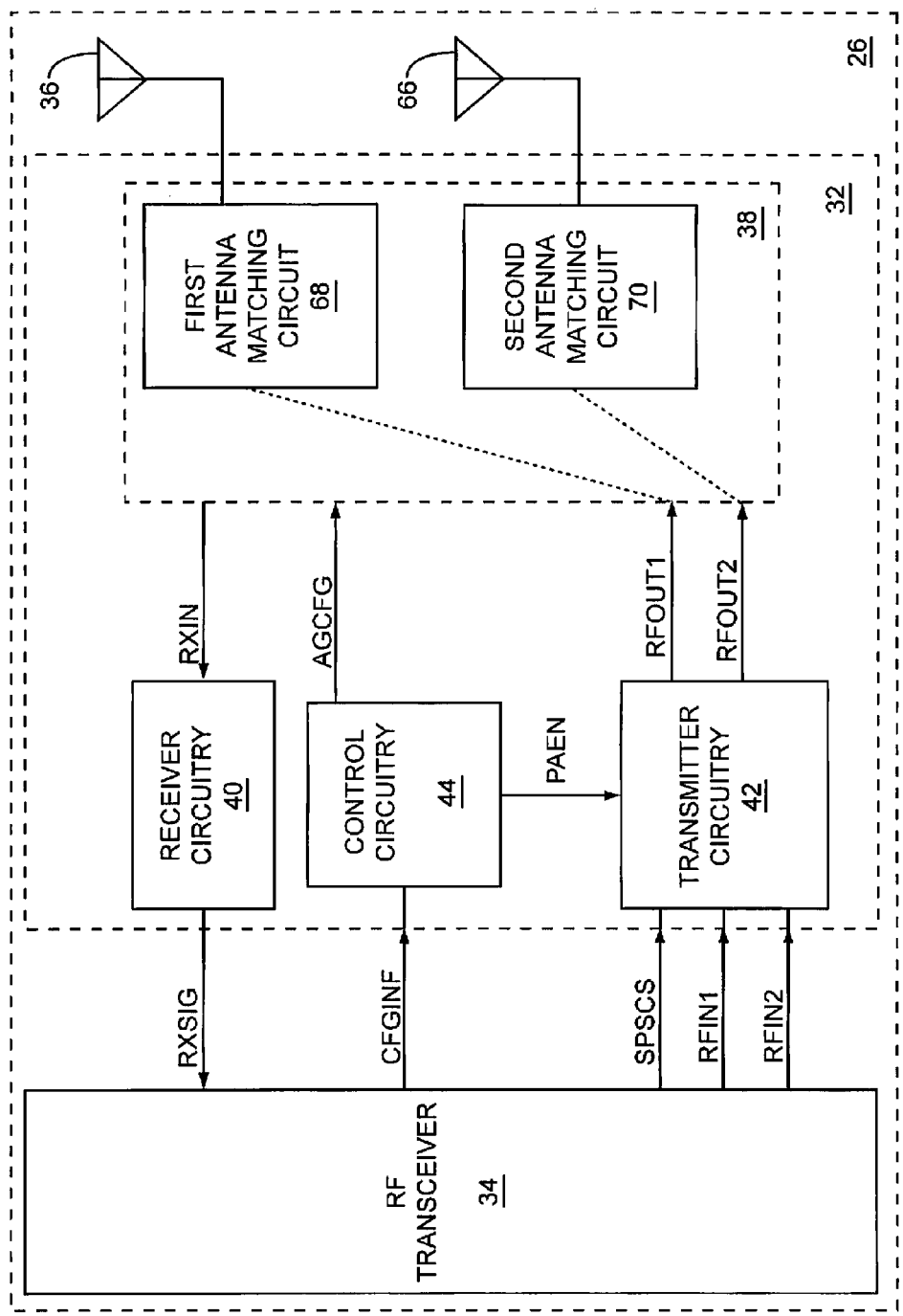
FIG. 8 shows details of the RF aggregation circuitry illustrated in FIG. 7A according to an alternate embodiment of the RF aggregation circuitry.

FIG. 8 shows details of the RF aggregation circuitry 38 illustrated in FIG. 7A according to an alternate embodiment of the RF aggregation circuitry 38. The RF aggregation circuitry 38 includes a first antenna matching circuit 68 and a second antenna matching circuit 70. The output of the first final stage 56 (FIG. 4) may be coupled to the first antenna 36 through circuitry in the RF aggregation circuitry 38 and through the first antenna matching circuit 68. The output of the second final stage 62 (FIG. 4) may be coupled to the second antenna 66 through circuitry in the RF aggregation circuitry 38 and through the second antenna matching circuit 70. During the first operating mode, the first antenna matching circuit 68 may provide at least an approximate impedance match between the output of the first final stage 56 and the first antenna 36. During the second operating mode, the first antenna matching circuit 68 may provide at least an approximate impedance match between the output of the first final stage 56 and the first antenna 36, and the second antenna matching circuit 70 may provide at least an approximate impedance match between the output of the second final stage 62 and the second antenna 66. Impedance matching to the first antenna 36 and to the second antenna 66 may improve operating performance of the first RF communications terminal 26.

Figure 9:
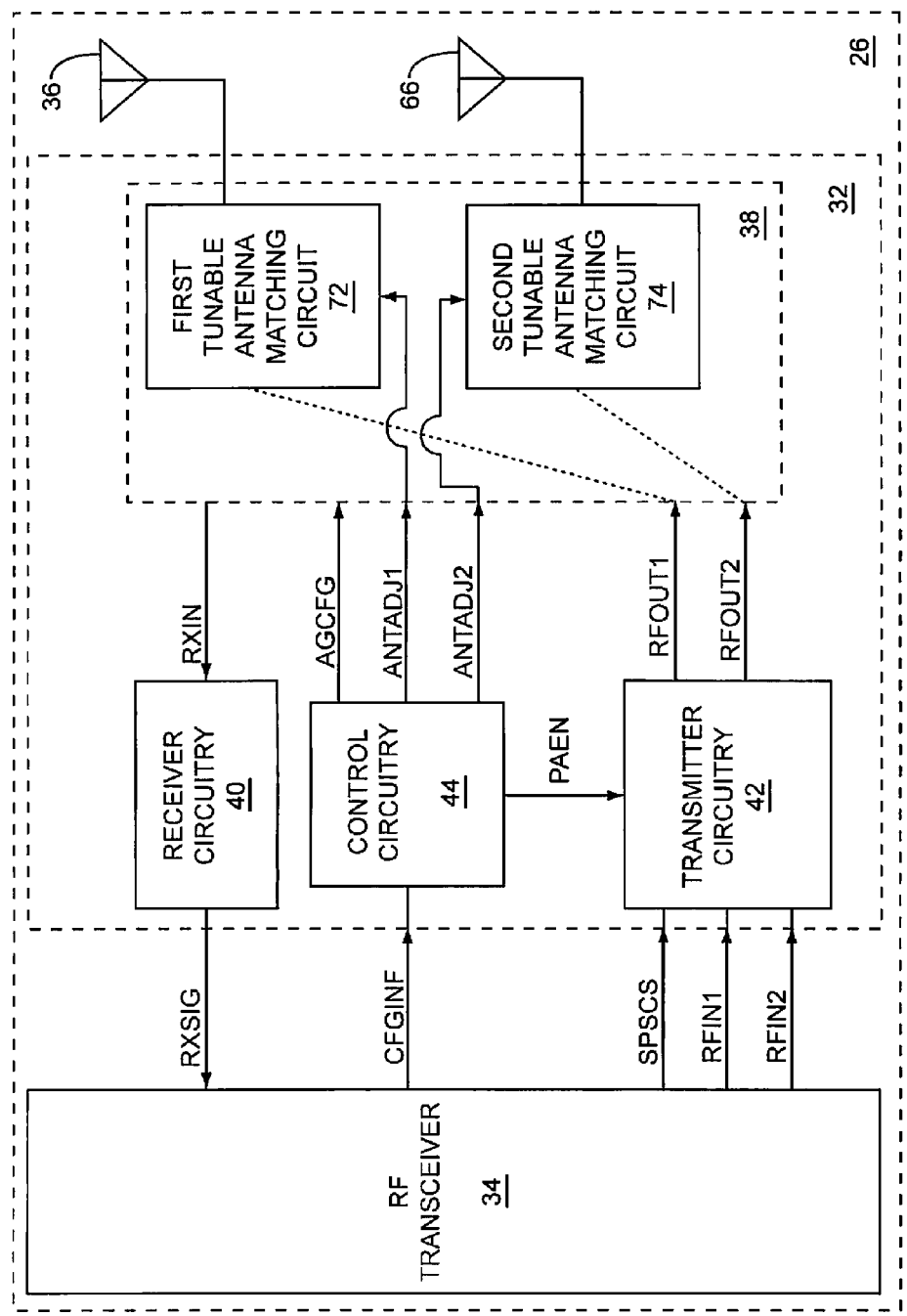
FIG. 9 shows details of the RF aggregation circuitry illustrated in FIG. 7A according to an additional embodiment of the RF aggregation circuitry.

FIG. 9 shows details of the RF aggregation circuitry 38 illustrated in FIG. 7A according to an additional embodiment of the RF aggregation circuitry 38. The RF aggregation circuitry 38 includes a first tunable antenna matching circuit 72 and a second tunable antenna matching circuit 74. The output of the first final stage 56 (FIG. 4) may be coupled to the first antenna 36 through circuitry in the RF aggregation circuitry 38 and through the first tunable antenna matching circuit 72. The output of the second final stage 62 (FIG. 4) may be coupled to the second antenna 66 through circuitry in the RF aggregation circuitry 38 and through the second tunable antenna matching circuit 74.

The control circuitry 44 may provide a first antenna impedance adjustment signal ANTADJ1 to the first tunable antenna matching circuit 72 and may provide a second antenna impedance adjustment signal ANTADJ2 to the second tunable antenna matching circuit 74. As such, the control circuitry 44 is coupled to the first tunable antenna matching circuit 72 and to the second tunable antenna matching circuit 74. An impedance of the first tunable antenna matching circuit 72 may be based on the first antenna impedance adjustment signal ANTADJ1 and an impedance of the second tunable antenna matching circuit 74 may be based on the second antenna impedance adjustment signal ANTADJ2. The first antenna impedance adjustment signal ANTADJ1 and the second antenna impedance adjustment signal ANTADJ2 may be based on the configuration information CFGINF.

During the first operating mode, the control circuitry 44 may adjust the impedance of the first tunable antenna matching circuit 72 using the first antenna impedance adjustment signal ANTADJ1 to provide at least an approximate impedance match between the output from the first final stage 56 and the first antenna 36. During the second operating mode, the control circuitry 44 may adjust the impedance of the first tunable antenna matching circuit 72 using the first antenna impedance adjustment signal ANTADJ1 to provide at least an approximate impedance match between the output from the first final stage 56 and the first antenna 36. Further, during the second operating mode, the control circuitry 44 may adjust the impedance of the second tunable antenna matching circuit 74 using the second antenna impedance adjustment signal ANTADJ2 to provide at least an approximate impedance match between the output from the second final stage 62 and the second antenna 66. Impedance matching to the first antenna 36 and to the second antenna 66 may improve operating performance of the first RF communications terminal 26.

In one embodiment of the first tunable antenna matching circuit 72, the impedance of the first tunable antenna matching circuit 72 during the first operating mode is not equal to the impedance of the first tunable antenna matching circuit 72 during the second operating mode.

The first final stage 56 may have a first RF load line having a first slope that corresponds to the impedance of the first tunable antenna matching circuit 72. The second final stage 62 may have a second RF load line having a second slope that corresponds to the impedance of the second tunable antenna matching circuit 74. During the second operating mode, the first slope may be about equal to the second slope.

Figure 10:
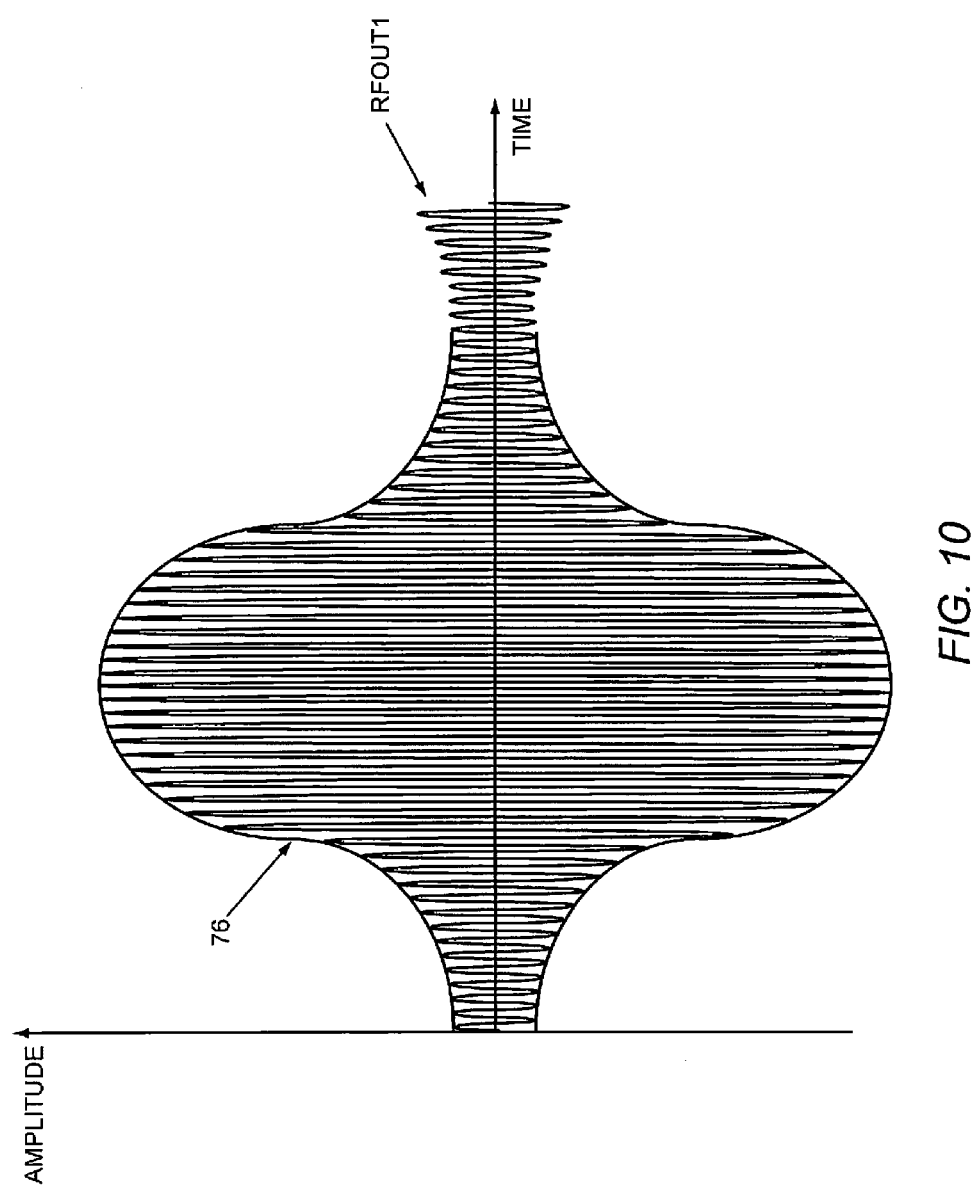
FIG. 10 is a graph showing details of a first RF output signal according to one embodiment of the first RF communications terminal.

FIG. 10 is a graph showing details of the first RF output signal RFOUT1 according to one embodiment of the first RF communications terminal 26. The first RF output signal RFOUT1 includes amplitude modulation. As such, the first RF output signal RFOUT1 has an RF envelope 76 that follows the amplitude modulation. The second RF output signal RFOUT2 (not shown) may also be amplitude modulated. In other embodiments of the first RF communications terminal 26, either the first RF output signal RFOUT1, the second RF output signal RFOUT2, or both may not include amplitude modulation. In general, either or both of the first RF output signal RFOUT1 and the second RF output signal RFOUT2 may include amplitude modulation, phase modulation, frequency modulation, or any combination thereof. For example, polar modulation is a combination of amplitude modulation and phase modulation.

Figure 11B:
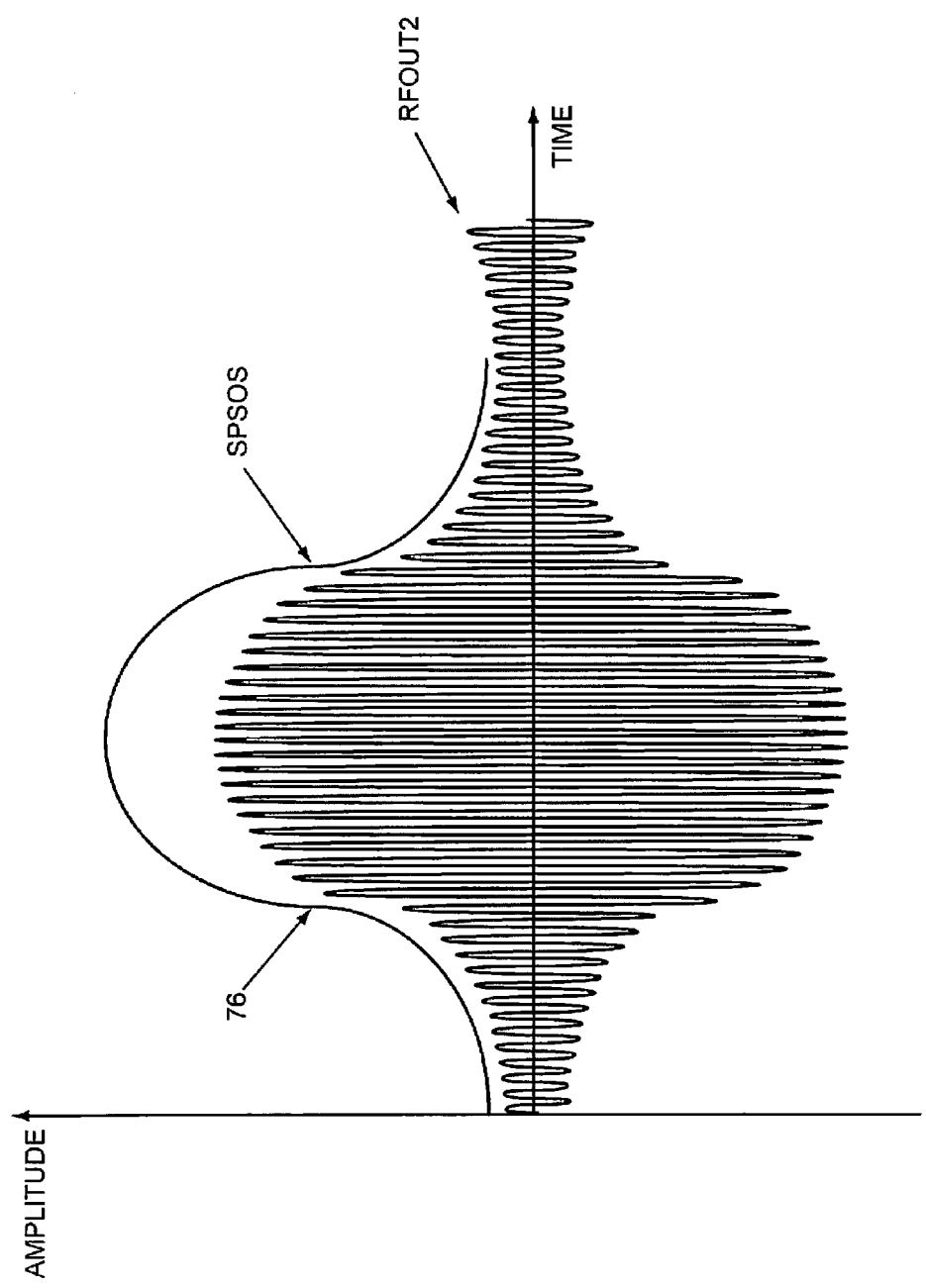

FIGS. 11A and 11B are graphs showing details of the first RF output signal RFOUT1, the second RF output signal RFOUT2, and the switching power supply output signal SPSOS during the second operating mode, according to an alternate embodiment of the first RF communications terminal 26. FIG. 11A shows the first RF output signal RFOUT1 and the switching power supply output signal SPSOS. The first RF output signal RFOUT1 includes amplitude modulation. The switching power supply output signal SPSOS mirrors the RF envelope 76 of the first RF output signal RFOUT1. As such, the switching power supply output signal SPSOS provides envelope tracking of the first RF output signal RFOUT1.

FIG. 11B shows the second RF output signal RFOUT2 and the switching power supply output signal SPSOS. The switching power supply output signal SPSOS shown in FIG. 11B is identical to the switching power supply output signal SPSOS shown in FIG. 11A. The second RF output signal RFOUT2 includes amplitude modulation. However, the average power level of the second RF output signal RFOUT2 shown in FIG. 11B is less than the average power level of the first RF output signal RFOUT1 shown in FIG. 11A since the amplitude peaks of the second RF output signal RFOUT2 are smaller than the amplitude peaks of the first RF output signal RFOUT1. However, the amplitude modulation of the second RF output signal RFOUT2 tracks the switching power supply output signal SPSOS. As such, the switching power supply output signal SPSOS provides envelope tracking of the second RF output signal RFOUT2.

The amplitude modulation of the first RF output signal RFOUT1 and the second RF output signal RFOUT2 may be provided by amplitude modulating the first RF input signal RFIN1, the second RF input signal RFIN2, or both. However, since the switching power supply output signal SPSOS mirrors the RF envelope 76 of the first RF output signal RFOUT1, the first final stage 56 may operate in saturation, such that the amplitude modulation is provided by the switching power supply output signal SPSOS. The first RF input signal RFIN1 may or may not be amplitude modulated. However, the instantaneous amplitude of the first RF input signal RFIN1 is large enough to drive the first final stage 56 into saturation. In one embodiment of the first RF communications terminal 26, during the second operating mode, the first final stage 56, the second final stage 62, or both operate in saturation.

Figure 12:
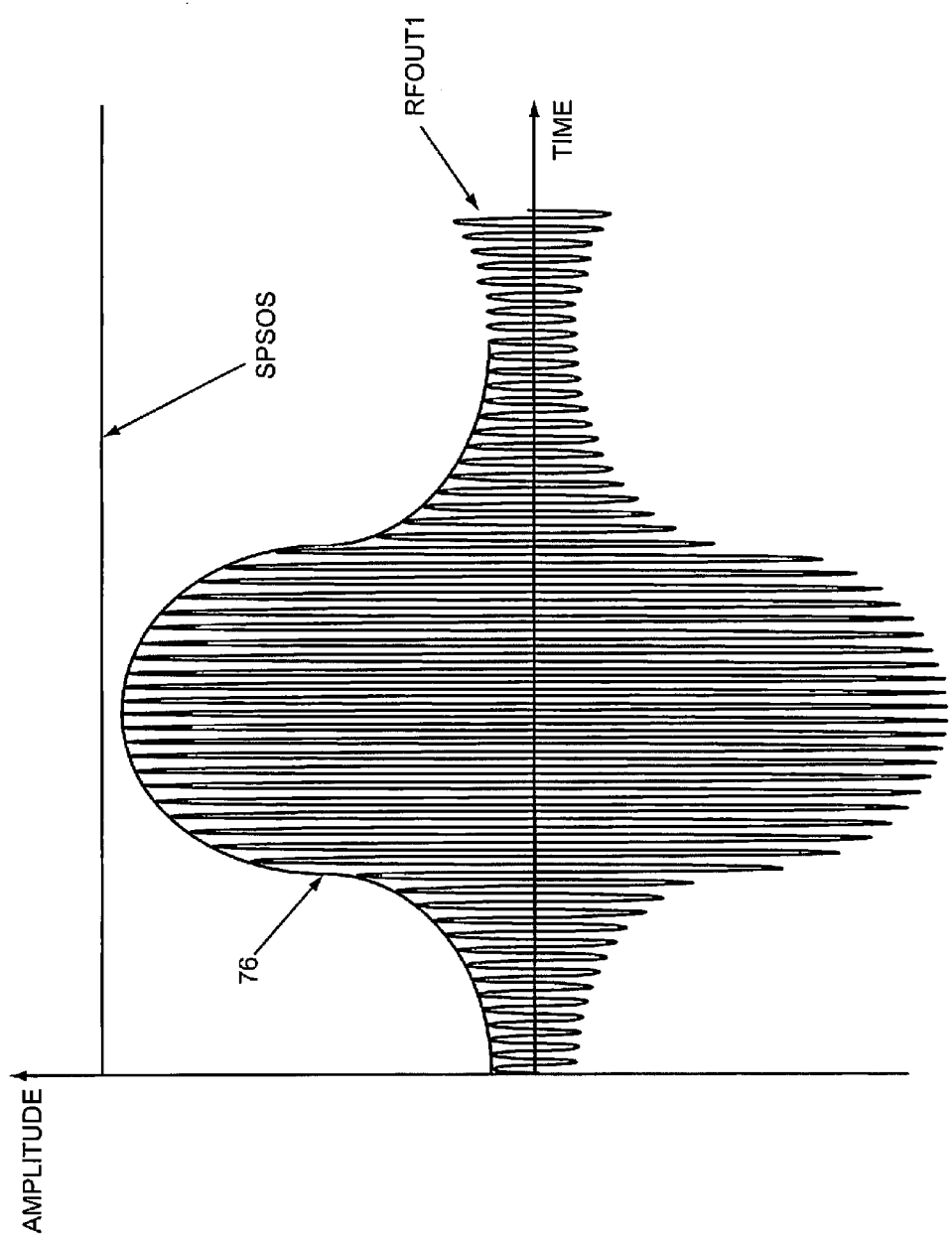
FIG. 12 is a graph showing details of the first RF output signal and the switching power supply output signal according to an additional embodiment of the first RF communications terminal.

FIG. 12 is a graph showing details of the first RF output signal RFOUT1 and the switching power supply output signal SPSOS according to an additional embodiment of the first RF communications terminal 26. The first RF output signal RFOUT1 includes amplitude modulation and the switching power supply output signal SPSOS is set to a fixed value. Therefore, the first RF input signal RFIN1 is amplitude modulated to provide the amplitude modulated first RF output signal RFOUT1.

Figure 13:
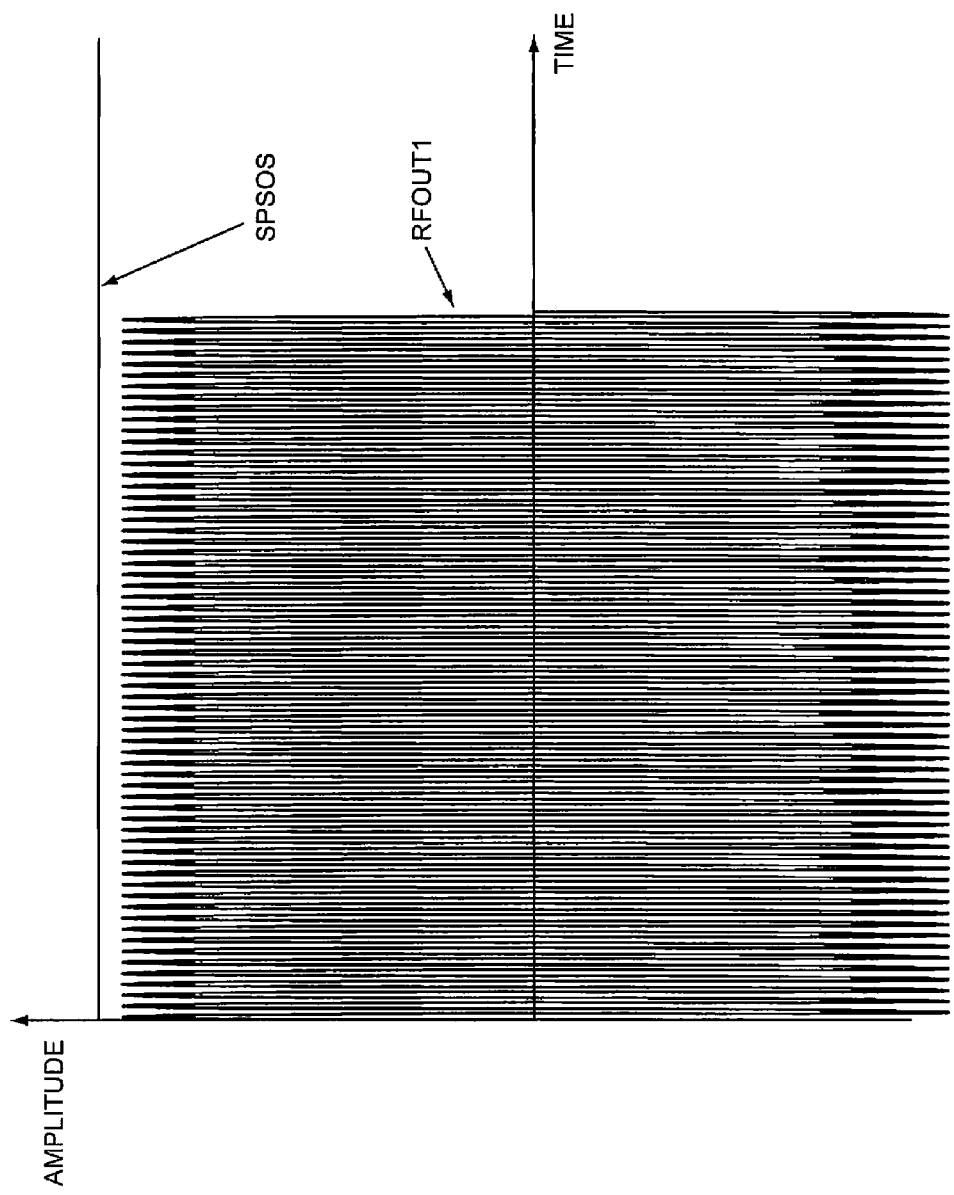
FIG. 13 is a graph showing details of the first RF output signal and the switching power supply output signal according to another embodiment of the first RF communications terminal.

FIG. 13 is a graph showing details of the first RF output signal RFOUT1 and the switching power supply output signal SPSOS according to another embodiment of the first RF communications terminal 26. The first RF output signal RFOUT1 is not amplitude modulated and the switching power supply output signal SPSOS is set to a fixed value. Therefore, the first RF input signal RFIN1 is not amplitude modulated to provide the non-amplitude modulated first RF output signal RFOUT1.

Figure 14:
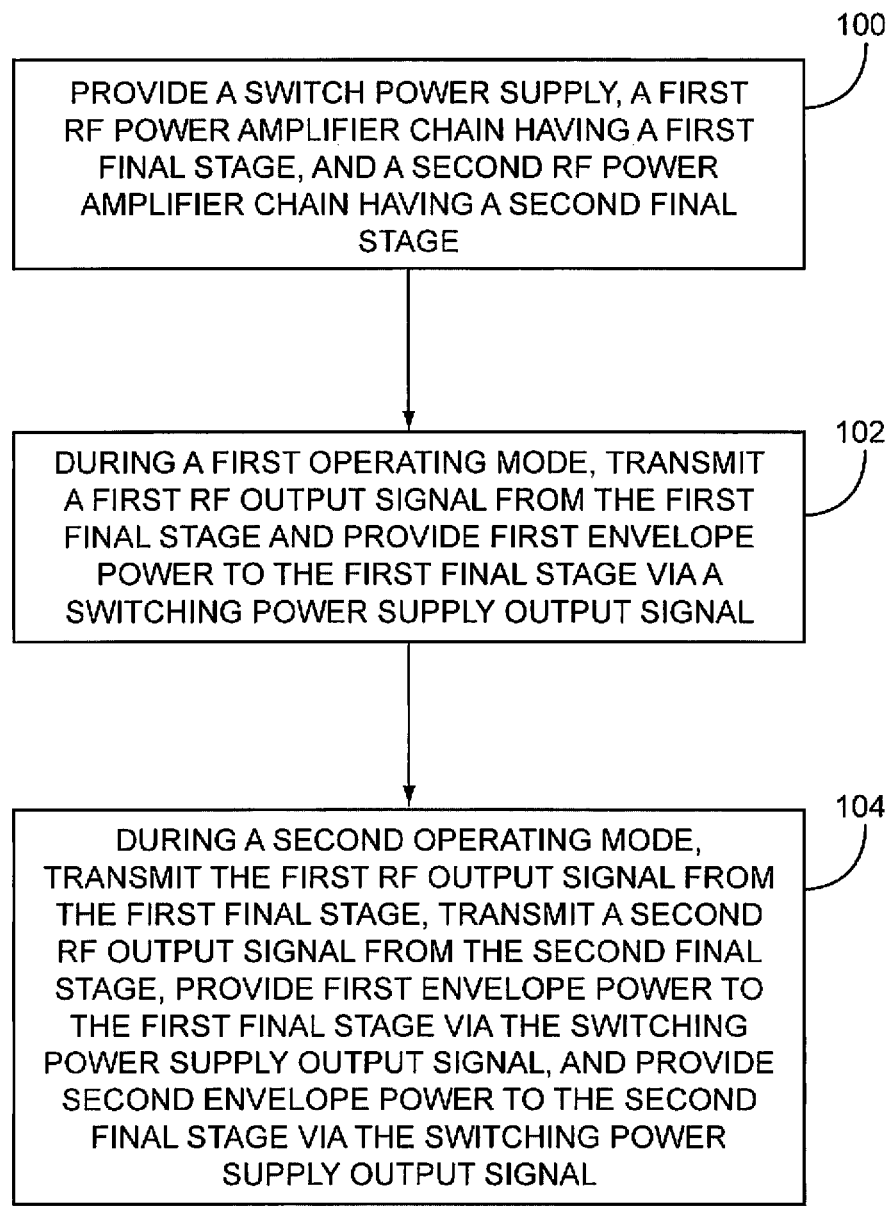
FIG. 14 is a flowchart illustrated a process for using the first RF communications terminal according to one embodiment of the first RF communications terminal.

FIG. 14 is a flowchart illustrated a process for using the first RF communications terminal 26 according to one embodiment of the first RF communications terminal 26. The process begins by providing the switching power supply 50 (FIG. 5), the first RF power amplifier chain 46 (FIG. 5) having the first final stage 56 (FIG. 5), and the second RF power amplifier chain 48 (FIG. 5) having the second final stage 62 (FIG. 5)(Step 100). The process continues by during the first operating mode, transmitting the first RF output signal RFOUT1 from the first final stage 56 and providing the first envelope power to the first final stage 56 via the switching power supply output signal SPSOS (Step 102). The process completes by during the second operating mode, transmitting the first RF output signal RFOUT1 from the first final stage 56, transmitting the second RF output signal RFOUT2 from the second final stage 62, providing the first envelope power to the first final stage 56 via the switching power supply output signal SPSOS, and providing the second envelope power to the second final stage 62 via the switching power supply output signal SPSOS (Step 104).

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
   providing a switching power supply, a first radio frequency (RF) power amplifier chain having a first final stage, and a second RF power amplifier chain having a second final stage;
   during a first operating mode:
      transmitting a first RF output signal from the first final stage; and
      providing first envelope power to the first final stage via a switching power supply output signal; and
   during a second operating mode:
      transmitting the first RF output signal from the first final stage;
      transmitting a second RF output signal from the second final stage;
      providing first envelope power to the first final stage via the switching power supply output signal; and
      providing second envelope power to the second final stage via the switching power supply output signal.

2. The method of claim 1 wherein an output from the first final stage is coupled to a first antenna and an output from the second final stage is coupled to a second antenna.

3. The method of claim 2 wherein the first antenna is a primary antenna and the second antenna is a diversity antenna.

4. The method of claim 2 further comprising:
   providing a first tunable antenna matching circuit coupled between the output of the first final stage and the first antenna;
   providing a second tunable antenna matching circuit coupled between the output of the second final stage and the second antenna;
   adjusting an impedance of the first tunable antenna matching circuit to provide at least an approximate impedance match between the output from the first final stage and the first antenna during the first operating mode;
   adjusting the impedance of the first tunable antenna matching circuit to provide at least an approximate impedance match between the output from the first final stage and the first antenna during the second operating mode; and
   adjusting an impedance of the second tunable antenna matching circuit to provide at least an approximate impedance match between the output from the second final stage and the second antenna during the second operating mode.

5. The method of claim 4 wherein the impedance of the first tunable antenna matching circuit during the first operating mode is not equal to the impedance of the first tunable antenna matching circuit during the second operating mode.

6. The method of claim 2 wherein during the second operating mode, modulation of the second RF output signal is synchronized to modulation of the first RF output signal.

7. The method of claim 6 wherein during the second operating mode, a carrier of the first RF output signal is phase-shifted from a carrier of the second RF output signal.

8. The method of claim 6 wherein during the second operating mode, an average power level of the first RF output signal is not equal to an average power level of the second RF output signal.

9. The method of claim 6 wherein during the second operating mode, the modulation of the first RF output signal comprises amplitude modulation, the modulation of the second RF output signal comprises amplitude modulation, and the switching power supply output signal provides envelope tracking of the first RF output signal and the second RF output signal.

10. A radio frequency (RF) communications terminal comprising:
    a first RF power amplifier chain having a first final stage;
    a second RF power amplifier chain having a second final stage;
    a switching power supply adapted to provide first envelope power to the first final stage via a switching power supply output signal and adapted to provide second envelope power to the second final stage via the switching power supply output signal; and
    control circuitry coupled the second RF power amplifier chain and adapted to operate in a first operating mode, a second operating mode, and a third operating mode, such that:
       during operation in the first operating mode:
          the RF communications terminal transmits a first RF output signal from the first final stage; and
          the switching power supply provides the first envelope power to the first final stage; and
       during operation in the second operating mode:
          the RF communications terminal transmits the first RF output signal from the first final stage;
          the RF communications terminal transmits a second RF output signal from the second final stage; and
          the switching power supply provides the first envelope power and the second envelope power to the first final stage and the second final stage.

11. The RF communications terminal of claim 10 wherein an output from the first final stage is coupled to an antenna and an output from the second final stage is coupled to the antenna.

12. The RF communications terminal of claim 10 wherein an output from the first final stage is coupled to a first antenna and an output from the second final stage is coupled to a second antenna.

13. The RF communications terminal of claim 12 wherein the first antenna is a primary antenna and the second antenna is a diversity antenna.

14. The RF communications terminal of claim 12 further comprising:
    a first tunable antenna matching circuit coupled between the output of the first final stage and the first antenna; and
    a second tunable antenna matching circuit coupled between the output of the second final stage and the second antenna.

15. The RF communications terminal of claim 14 wherein the control circuitry is further coupled to the first tunable antenna matching circuit and to the second tunable antenna matching circuit, and is further adapted to:

adjust an impedance of the first tunable antenna matching circuit to provide at least an approximate impedance match between the output from the first final stage and the first antenna during the first operating mode;

adjust the impedance of the first tunable antenna matching circuit to provide at least an approximate impedance match between the output from the first final stage and the first antenna during the second operating mode; and adjust an impedance of the second tunable antenna matching circuit to provide at least an approximate impedance match between the output from the second final stage and the second antenna during the second operating mode.

16. The RF communications terminal of claim 15 wherein the impedance of the first tunable antenna matching circuit during the first operating mode is not equal to the impedance of the first tunable antenna matching circuit during the second operating mode.

17. The RF communications terminal of claim 14 wherein:
the first final stage has a first RF load line having a first slope corresponding to an impedance of the first tunable antenna matching circuit; and
the second final stage has a second RF load line having a second slope corresponding to an impedance of the second tunable antenna matching circuit.

18. The RF communications terminal of claim 17 wherein during the second operating mode, the first slope is about equal to the second slope.

19. The RF communications terminal of claim 12 wherein during the second operating mode, modulation of the second RF output signal is synchronized to modulation of the first RF output signal.

20. The RF communications terminal of claim 19 wherein during the second operating mode, a carrier of the first RF output signal is phase-shifted from a carrier of the second RF output signal.

21. The RF communications terminal of claim 19 wherein during the second operating mode, an average power level of the first RF output signal is not equal to an average power level of the second RF output signal.

22. The RF communications terminal of claim 19 wherein during the second operating mode, the modulation of the first RF output signal comprises amplitude modulation, the modulation of the second RF output signal comprises amplitude modulation, and the switching power supply output signal provides envelope tracking of the first RF output signal and the second RF output signal.

23. The RF communications terminal of claim 22 wherein during the second operating mode, at least one of the first final stage and the second final stage operates in saturation.

24. The RF communications terminal of claim 12 wherein during the first operating mode, a maximum average power level transmitted by the first antenna is less than 25 decibel milliwatts (dBm), and during the second operating mode, a sum of a maximum average power level transmitted by the first antenna and a maximum average power level transmitted by the second antenna is less than 25 dBm.

25. The RF communications terminal of claim 12 wherein during the first operating mode, the second final stage is disabled.

26. The RF communications terminal of claim 12 wherein the RF communications terminal is a multi-mode multi-band RF communications terminal.

27. The RF communications terminal of claim 26 wherein the RF communications terminal is a mobile communications terminal.

28. The RF communications terminal of claim 12 wherein the first final stage is a multi-mode final stage and second final stage is a single-mode final stage.

* * * * *